United States Patent
Falcon

(10) Patent No.: US 7,522,065 B2
(45) Date of Patent: Apr. 21, 2009

(54) METHOD AND APPARATUS FOR PROXIMITY SENSING IN A PORTABLE ELECTRONIC DEVICE

(75) Inventor: Stephen R. Falcon, Woodinville, WA (US)

(73) Assignee: Microsoft Corporation, Redmond, WA (US)

( * ) Notice: Subject to any disclaimer, the term of this patent is extended or adjusted under 35 U.S.C. 154(b) by 854 days.

(21) Appl. No.: 10/966,481

(22) Filed: Oct. 15, 2004

(65) Prior Publication Data

US 2006/0093161 A1 May 4, 2006

(51) Int. Cl.
*H04M 1/60* (2006.01)
*H03G 3/20* (2006.01)
*G09G 5/00* (2006.01)

(52) U.S. Cl. .................. 340/686.6; 381/107; 455/567; 455/569.1; 455/574; 379/388.01; 379/390.01; 345/169

(58) Field of Classification Search .............. 340/686.6; 381/104, 107; 455/567, 569.1, 574; 379/388.01, 379/390.01; 345/169
See application file for complete search history.

(56) References Cited

U.S. PATENT DOCUMENTS

| | | | | |
|---|---|---|---|---|
| 5,224,151 | A * | 6/1993 | Bowen et al. | 455/569.1 |
| 5,610,971 | A * | 3/1997 | Vandivier | 455/569.2 |
| 5,729,604 | A * | 3/1998 | Van Schyndel | 379/388.01 |
| 5,881,377 | A * | 3/1999 | Giel et al. | 455/343.1 |
| 6,014,573 | A * | 1/2000 | Lehtonen et al. | 455/569.1 |
| 6,246,862 | B1 * | 6/2001 | Grivas et al. | 455/566 |
| 6,532,447 | B1 * | 3/2003 | Christensson | 704/275 |
| 6,560,466 | B1 * | 5/2003 | Skorko | 455/567 |
| 6,708,021 | B1 * | 3/2004 | Shim et al. | 455/90.1 |
| 6,853,850 | B2 * | 2/2005 | Shim et al. | 455/550.1 |
| 6,925,296 | B2 * | 8/2005 | Mattisson | 455/355 |
| 7,113,811 | B2 * | 9/2006 | Goris et al. | 455/574 |
| 7,196,316 | B2 * | 3/2007 | Chan et al. | 250/221 |
| 7,206,613 | B2 * | 4/2007 | Kim et al. | 455/567 |
| 7,224,981 | B2 * | 5/2007 | Deisher et al. | 455/456.1 |
| 7,260,422 | B2 * | 8/2007 | Knoedgen | 455/569.1 |
| 2004/0142705 | A1 | 7/2004 | Casebolt et al. | |
| 2005/0063556 | A1 * | 3/2005 | McEachen et al. | 381/104 |
| 2005/0285934 | A1 * | 12/2005 | Carter | 348/14.06 |
| 2006/0022950 | A1 * | 2/2006 | Friedrichs | 345/169 |

OTHER PUBLICATIONS

How They Work; The Capacitive Sensor, pp. 1-3, Sep. 15, 2004 www.sensorland.com/HowPage018.html.
Specific Use: Capacitive Proximity Sensor, pp. 8 and 9, Sep. 20, 2004, www.imaginetools.com/documentation/docs/manuals/MicroStarterKit/approxs.htm.

* cited by examiner

*Primary Examiner*—George A Bugg
*Assistant Examiner*—Anne V Lai
(74) *Attorney, Agent, or Firm*—Wolf, Greenfield & Sacks, P.C.

(57) ABSTRACT

A portable electronic device that automatically detects its mode of use and alters a characteristic of its user interface to match the mode of use. A mobile telephone is described as an example of a portable electronic device. The telephone is equipped with a proximity sensor that may indicate whether the telephone is held close or far from the user's face. Based on the proximity to the user's face, gains in the audio interface are adjusted. The gain is reduced when the device is held close to a user's face and increased when the device is moved away from the user's face. This approach is well suited for use in connection with portable devices that use voice command interfaces.

36 Claims, 5 Drawing Sheets

METHOD AND APPARATUS FOR PROXIMITY SENSING IN A PORTABLE ELECTRONIC DEVICE

BACKGROUND OF INVENTION

1. Field of Invention

This invention relates generally to portable electronic devices and more particularly to devices with improved usability.

2. Discussion of Related Art

Many portable electronic devices contain audio interfaces, such as speakers and/or microphones, that allow users to exchange information with the portable device in audio form. Audio interfaces often have controls that allow users to adjust the volume of sound produced by the audio interface so that the users can use the devices in multiple modes. For example, many mobile devices give users the option of holding the mobile device close to their ears or to adjust the volume of sound produced by the device so that users can hear sound when the device is held away from their ears.

Present mobile devices generally rely on manual control to adjust the gain of the speaker so that the sound volume is set based on the desired mode of use. A drawback of such an approach is that users may place the device near their ears when the volume is turned up. As a result, the user might experience sound pressure levels that are unpleasant and possibly damaging to their ears.

Some devices employ methods that help prevent users from being exposed to high sound pressure levels if the users forget to reduce the volume level before placing the device near their ears. One such method, incorporated into some cellular telephones, utilizes a fade-in method. The speaker driver in the phone modifies the sound to be played by the device to fade-in any sound coming out of the device. The gradual fade-in prevents any sudden blasts of sound and gives users a chance to move their phones from their ears before sound levels reach an uncomfortable level.

Another approach used in current devices is to provide a dual speaker system. Mobile devices with dual speaker systems contain one speaker in a surface of the device intended to be placed near a user's ear and another speaker on the opposite side. The speaker intended to face the user emits low sound pressure levels and is intended for use when the device is held close to the user's face. The speaker facing away from the user can emit larger sound pressure levels and is intended for use when the device is held away from the user's face.

A similar issue arises for portable devices that include microphones designed to pickup a user's voice. Problems in picking up the voice signal can also occur when users may move the device close to their mouths or away from their mouths. Automatic Gain Control (AGC) is one method for dealing with the differences in sound pressure levels at the microphone caused by users changing the distance between devices and their mouths. AGC sets the gain of the microphone based on the power level of the signal picked up by the microphone. When a signal is strong, such as when users talk with the devices held close to their mouths, the gain is reduced. When a signal is weak, such as when users talk with the devices held away from their mouths, the gain is increased.

SUMMARY OF INVENTION

Aspects of the invention relate to an electronic device with a sensor that can indicate the mode of use of the phone so that the adjustments in the user interface can be made based on the mode of use.

In one embodiment, the sensor indicates proximity of the electronic device to a human body part, which may be a user's face. A control circuit uses the output of the sensor to adjust the gain of an audio interface. The audio interface may be, for example, a speaker or a microphone.

In the described embodiments, the portable electronic device can operate in at least two modes—a close talk mode and a far talk mode. The output of the sensor is used to identify the appropriate mode of operation. In close talk mode, the gain is limited to levels appropriate for a speaker held close to a user's ear or a microphone held close to a user's mouth.

In one aspect, the invention relates to an electronic device that has an audio interface with a gain control input. A sensor indicates proximity to a human body part, and a control circuit that sets a signal level on the control output selectively in response to a signal level on the control circuit input.

In another aspect, the invention relates to an electronic device that has a housing, an audio interface mounted in the housing, a sensor that produces an output representative of a mode of use of the electronic device and a control circuit that sets a signal level on the control output selectively in response to a signal level on the control circuit input.

In yet another aspect, the invention relates to a method of operating an electronic device that involves detecting the proximity of the device to a human body part and automatically adjusting at least one operating characteristic of a user interface in the electronic device based on the detected proximity to a human body part.

In a further aspect, the invention relates to a method of operating an electronic device having a plurality of user interfaces. The method includes measuring at least one value relating to a use environment of the device; determining a mode of use of the electronic device form the at least one measured value; and exchanging information with a user through at least one of the plurality of user interfaces selected based on the determined mode of use.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

One embodiment of the invention is directed to a portable electronic device having an improved audio user interface. The device is equipped with a sensor that allows a controller within the device to determine its mode of use. For example, a user might operate the device in a "close talk mode" in which the device is held close to the user's face. Alternatively, the device may be operated in a "far talk mode" in which the device is held away from the user's face.

The controller within the portable electronic device may use information on the sensed user mode to control one or more operating parameters of the audio interface. For example, when the audio interface includes a speaker, the gain of the speaker may be controlled to provide sufficient volume that the user may hear sound from the device in far talk mode, but avoid damaging or uncomfortable sound levels in close talk mode. As another example, when the audio interface includes a microphone, a gain of the microphone may be adjusted to make the sound output therefrom more usable for a human user or an automated voice recognition system. Devices may be implemented in which the gain associated with one of a speaker or a microphone is adjusted or the gains of both a speaker and a microphone are adjusted.

The ability of the device to automatically adapt to the user's mode of use allows the user to fluidly alternate between modes. For example, a user may begin using the device in a close talk mode, but then move the device into a far talk mode to read information on a display screen, to enter information on a key pad, or for any other purpose. Using aspects of the present invention described herein, the user can interact with the device in either mode of use. As another example, a user may begin using the device in far talk mode but then bring the device into close talk mode for privacy. With the system described below, this switch in modes can be performed without requiring the user to manually adjust a volume control.

Figure 1A:
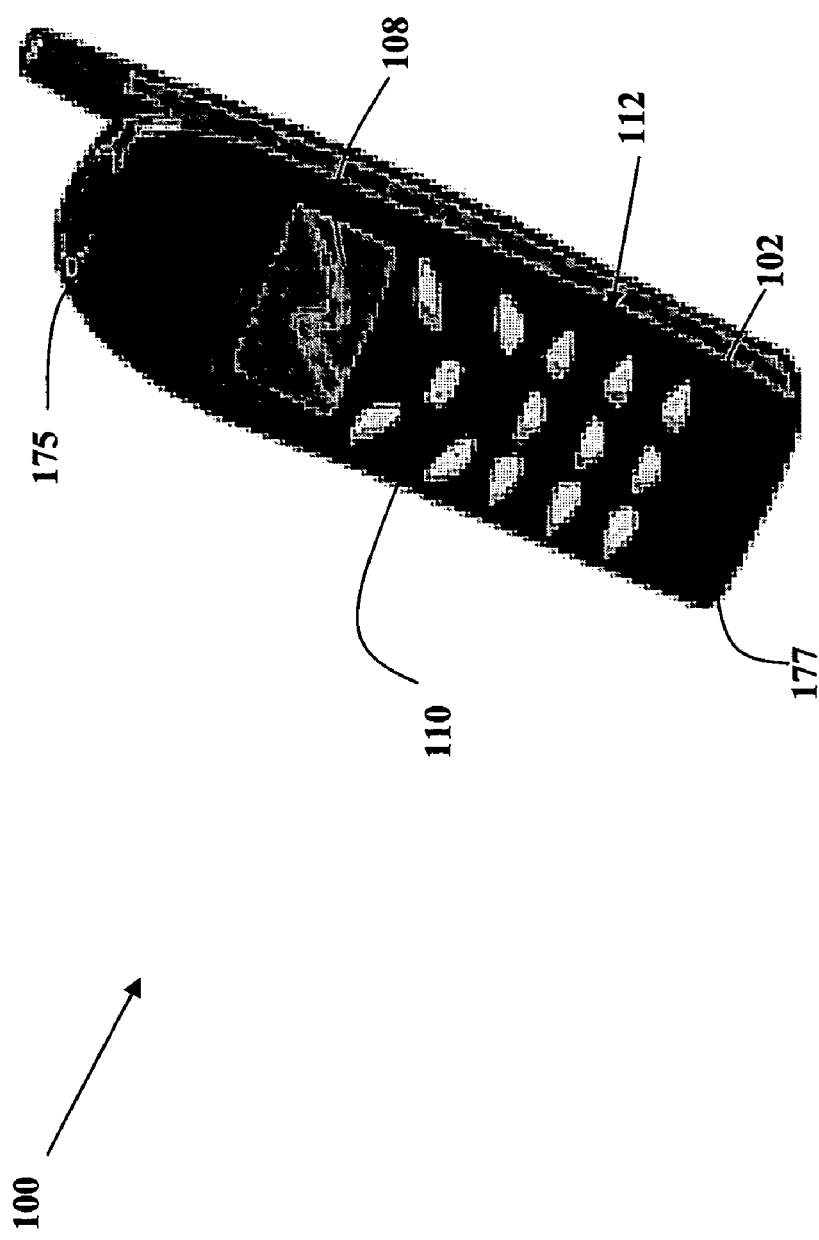
FIG. 1A is sketch of a portable electronic device with a sensor in accordance with one embodiment of the invention.

FIG. 1A is a sketch of a portable electronic device (i.e., a mobile phone 100), having an audio interface, on which aspects of the present invention can be employed. While a mobile phone is shown in FIG. 1A as an example of a portable electronic device with which aspects of the present invention can be employed, it should be appreciated that the invention is not limited in this respect, and can be used with any portable electronic device having a microphone and/or speaker, a non-limiting list of examples of which includes a pocket PC, a music player, such as an $MP_3$ player, or a portable digital assistant (PDA).

Mobile phone 100 has an audio interface that includes a speaker 104 (FIG. 2) positioned at speaker area 175 so that the device may output sounds that a user can hear and a microphone 106 (FIG. 2) positioned at microphone area 177 so that a user may input information to mobile phone 100 in audible form. In one embodiment, mobile phone 100 may record or transmit information provided through microphone 106 and may include a voice command feature such that information provided through microphone 106 can be interpreted as spoken commands for operations to be performed by mobile phone 100. However, the aspects of the present invention are not limited to a mobile device having these or any other particular features.

In the embodiment shown in FIG. 1A, mobile phone 100 includes a display 108 that provides a visual interface, which allows information to be presented to a user in text or graphical form, and several buttons, switches or other touch sensitive devices that a user may use to enter information, which are collectively illustrated by key pad 112. However, the aspects of the present invention are not limited to use with a device having these or any other particular user interface features.

In the mobile phone 100 illustrated as an example in FIG. 1A, the user interface devices are incorporated on a surface 110 which is generally planar. The aspects of the present invention described herein are not limited to use with devices having such a profile, and can be used with many mobile devices having curved or folding surfaces containing the user interface, or any other profile. When mobile phone 100 is used in a close talk mode, surface 110 may be placed adjacent the user's face. For example, speaker area 175 is placed adjacent a user's ear, and the microphone area 177 is placed adjacent the user's mouth.

To ascertain the mode of use of mobile phone 100, mobile phone 100 includes a proximity sensor 102. Sensor 102 is in the example of FIG. 1A located within surface 110, and produces an output indicating its proximity to other objects, such as the face of the user of mobile phone 100. However, sensor 102 may be located in any suitable location and is not limited to a positioning or mounting as shown.

In one embodiment, mobile phone 100 responds to two user modes: close talk mode and far talk mode. In close talk mode, users hold devices adjacent their ears or mouths (typically within about 3 inches from the user's face), whereas in far talk mode, the users hold devices further away (e.g., where they can see them or set them down), typically about 12 inches or more from the user's face. While each mode can be used for any purpose, close talk mode may often be used when a single user wishes to communicate using the audio interface, and far talk mode can be used when multiple users wish to communicate using the audio interface, or the user wishes to see a display on the device or to set it down while communicating.

In the embodiment shown in FIG. 1A, sensor 102 senses the proximity of an object, such as a user's face, to surface 110. Thus, the output of a proximity sensor 102 can act as an indication of whether the mobile phone 100 is being used in close talk mode or far talk mode. Control circuitry within mobile phone 100 may then control the audio interface to operate in the mode appropriate for the mode of use. Although a "binary" sense scheme is described in which the mobile phone 100 senses and responds to two modes of operation, the invention is not so limited.

Figure 1B:
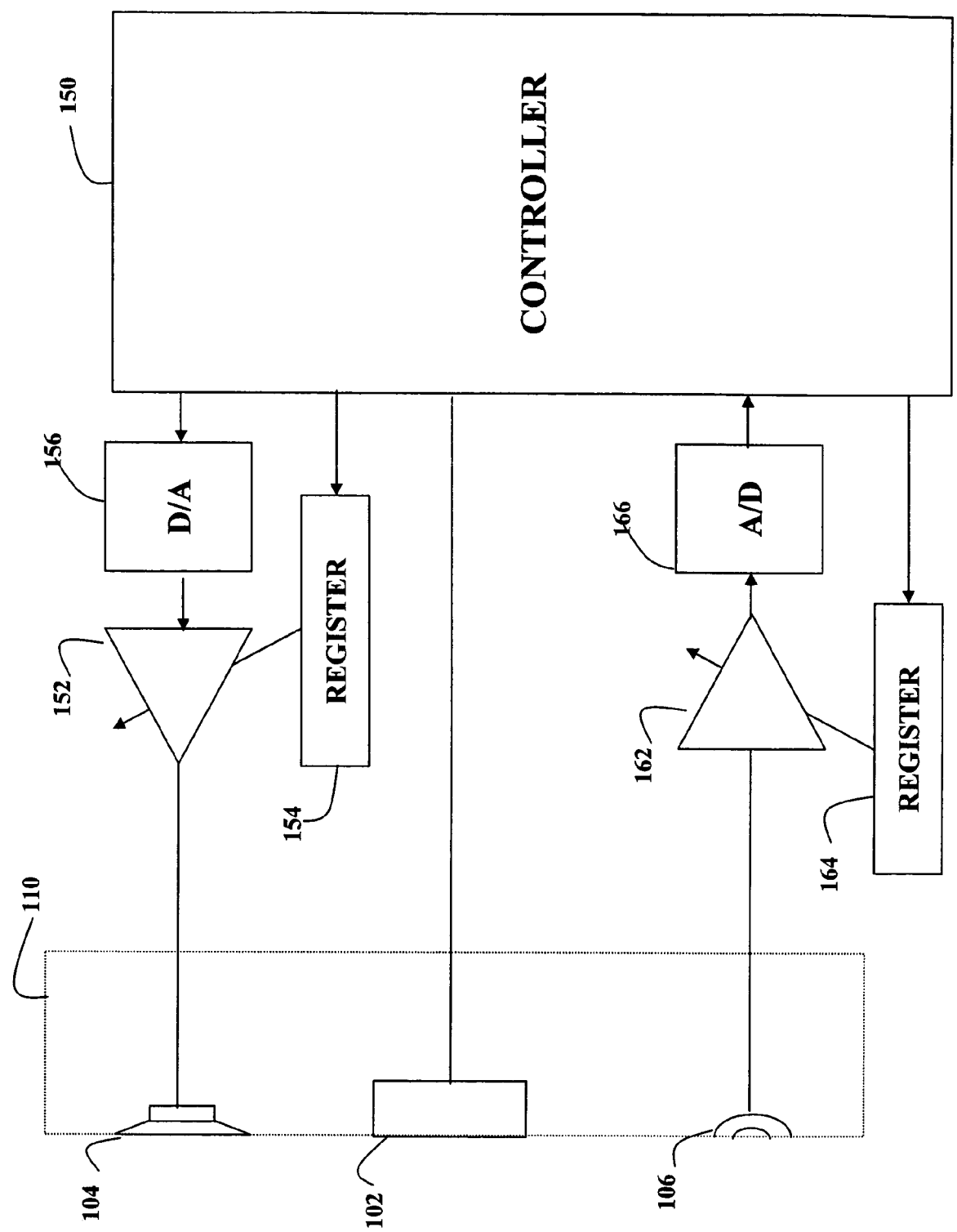
FIG. 1B is a simplified schematic of some aspects of the portable electronic device of FIG. 1A.

FIG. 1B is a simplified schematic of one illustrative implementation of the control circuitry within mobile phone 100. It should be appreciated that the control circuitry for the device is not limited to this or any other particular implementation, and can be implemented in any suitable manner. Speaker 104, microphone 106, and sensor 102 are shown to be mounted in surface 110. Speaker 104 is driven by amplifier 152. The signal for the amplifier 152 may be provided in digital form by controller 150 and converted by a digital-to-analog converter 156 to an analog input to the amplifier 152.

Amplifier 152 is a variable gain amplifier. In the illustrated embodiment of FIG. 1B, the gain of amplifier 152 is controlled by a digital value stored in register 154 by controller 150. As will be described in greater detail below, the digital value in register 154 is selected by controller 150 based on the use mode of mobile phone 100. It should be appreciated, though, that a gain adjustment need not be applied through a register and may be applied in any suitable manner.

Mobile phone 100 also includes a microphone 106, the output of which is provided to an amplifier 162. The amplified microphone signal is provided to an analog-to-digital converter 166, which converts the output of amplifier 162 to digital form so that it may be processed by controller 150. The gain applied by amplifier 162 is controlled by a digital value stored in register 164. The value in register 164 is supplied by controller 150 and may be selected based on the use mode of mobile phone 100.

In FIG. 1B, the sensor 102 is connected to controller 150, so that the output of sensor 102 can be used by the controller 150 to determine the use mode of the device. In one embodiment, sensor 102 is designed using the basic principles of a capacitor.

A capacitor has two electrodes that are separated by an insulator, such as air. The capacitance between two electrodes is expressed by the equation:

$$C = \frac{(\varepsilon A)}{d}$$

where C is the capacitance, $\varepsilon$ is the dielectric constant of the material between the electrodes, A is the area of the electrodes and d is the distance between the electrodes. As the distance (d) decreases, the capacitance (C) increases. This equation indicates that an indication of the distance, d, between two structures acting as electrodes can be determined by finding the capacitance between these structures.

In one embodiment, a first structure acting as the first electrode of a capacitor is mounted on surface 110, and may be any suitable conductor (e.g., a conducting plate). The second structure, acting as the second electrode of the capacitor, may be the user's face or other body part.

Figure 2:
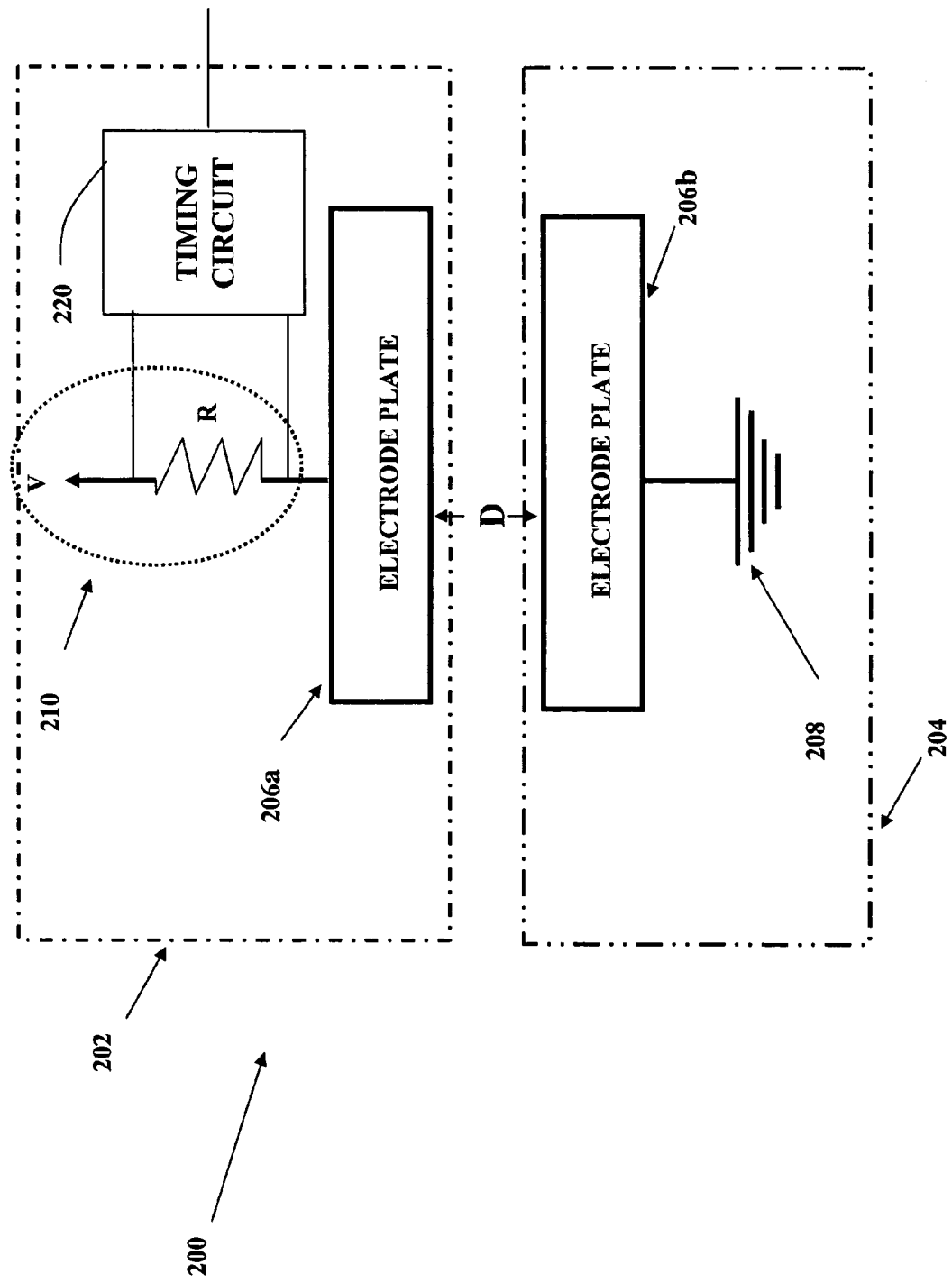
FIG. 2 is a circuit model illustrating operation of one illustrative implementation of the sensor of FIG. 1.

FIG. 2 displays a circuit model 200 illustrating the operation of the above-described embodiment of the proximity sensor 102. Section 202 of circuit model 200 contains elements which are incorporated inside mobile phone 100. Electrode plate 206a represents a conducting plate mounted on surface 110.

Section 204 is a model of a user, with electrode plate 206b corresponding to a user's face or other body part. A user's body may source or sink amounts of charge that are large relative to the charge on plate 206a. Thus, the user's body may be modeled as a ground, which is illustrated in FIG. 2 by connecting electrode plate 206b to ground 208.

As the mobile phone 100 is moved closer to a user's face, the distance D shown in FIG. 2 will decrease. As a result, the capacitance between electrode plates 206A and 206B will correspondingly increase. As the mobile phone 100 is moved further from the users face the capacitance will conversely decrease. Thus, the capacitance between electrode plates 206A and 206B indicates the proximity of mobile phone 100 to a user.

By measuring the capacitance between electrode plates 206A and 206B, an indication of the distance between mobile phone 100 and the user 204 may be determined. Any suitable technique for measuring the capacitance of a structure may be used. One illustrative way is to place a sense circuit 210 in series with the capacitor. In the illustrative embodiment, sense circuit 210 includes a resistor R of known value connected to electrode plate 206A. A voltage, V, may then be applied to the resistor, R, and the time constant of the current flow through the resistor may be measured. Because the time constant of the current flow is proportional to the product of the resistance R and the capacitance between the plates 206A and 206B, the capacitance may be computed by dividing the time constant by the value R.

Timing circuit 220 monitors the time constant of current flow through the resistor R when a voltage V is applied. For use with an embodiment having two operating modes (e.g., close talk and far talk), when timing circuit 220 identifies a time constant indicating a capacitance between electrode plates 206A and 206B representative of a distance D that would be considered close, it outputs a value indicating the mobile phone 100 is in close talk mode. Conversely, when timing circuit 220 measures a time constant indicating the distance D is relatively far, timing circuit 220 outputs a value indicating mobile phone 100 is in far talk mode. A threshold value for the time constant that separates close talk mode and far talk mode may be determined in any suitable manner. For example, the threshold value may be determined from the physical properties of sensor 102 in a model of a human body, or may be determined empirically.

The invention is not limited to use with a capacitive sensor and other types of sensors may be used. Regardless of the specific type of sensor used, once the mode of use of mobile phone 100 is indicated, controller 150 (FIG. 1B) may set the values in gain registers 154 and 164 that are appropriate for the mode of use. Some mobile devices have volume controls, allowing a user to set a preference for the volume of sounds output by speaker 104. For example, a user might specify a volume level through one of the keys in touch pad 112 or in any suitable manner. In one embodiment for use with devices having a volume control, any change in the gain value stored in register 154 will reflect the user's specified preference for the volume level.

Figure 3:
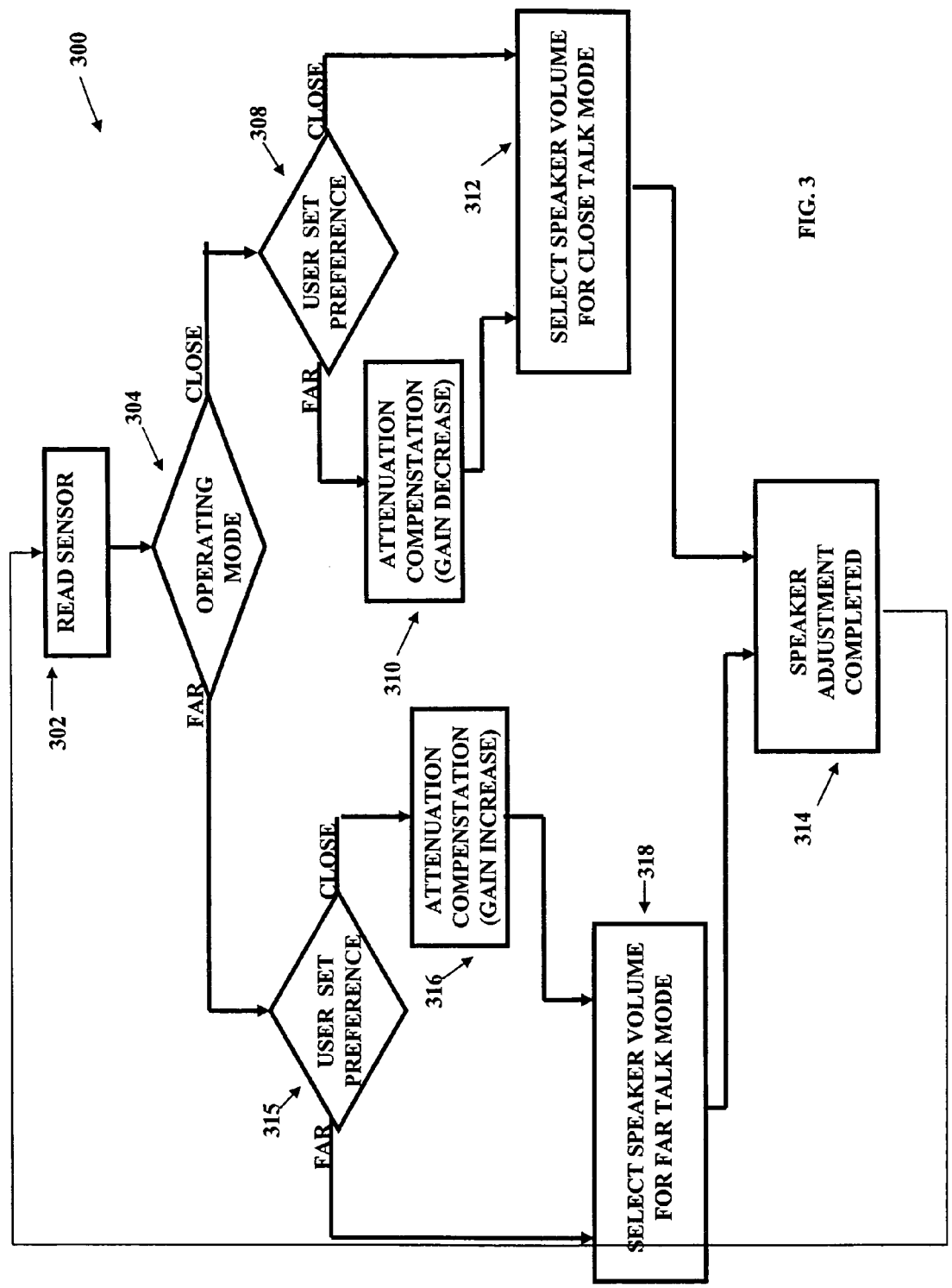
FIG. 3 is a flow chart of a process used to adjust speaker levels in the portable electronic device of FIG. 1 in accordance with the embodiment of the invention.

FIG. 3 shows a flow chart of a process used to set the gain for amplifier 152 driving speaker 104 in accordance with one embodiment of the invention. This process is illustrative, as the invention is not limited to setting the gain as shown and can set the gain for the speaker amplifier 152 in other ways.

The controller 150 may be programmed to perform the process 300 in any suitable manner, e.g., by having a plurality of instructions in any language (including microcode) stored in any computer readable medium accessible to a processor in the controller 150.

The process 300 uses various parameter values that may be represented as constant or variables within a program implementing the process. For example, the user could set the speaker volume while the device is in either close or far talk modes, and those may be stored for future reference. The labels SpeakerClosePref and SpeakerFarPref are used below to refer to the gain settings derived from a user volume setting while the device is in close talk mode or far talk mode, respectively. The device designer may also set maximum gain values to use for the speaker amplifier 152 in close and far talk modes, which are referred to below as SpeakerCloseMax and SpeakerFarMax, respectively. The device designer may further specify the amount the gain of amplifier 152 should decrease to compensate for the sound pressure level increase resulting from moving the device from the far-talk position to the close talk position (referred to as SpeakerCloseAtten below), and/or the amount the gain of amplifier 152 should increase to compensate for the opposite case of moving the device from the close talk position to the far talk position (referred to as SpeakerFarAtten below).

Block 302 represents the start of the process 300, where measurement results are read from sensor 102. Based on the obtained results, the mode of use of mobile phone 100 is determined, at block 302, and the process proceeds to decision block 304. When mobile phone 100 is being operated in close talk mode, the process proceeds to decision block 308.

At decision block 308 a determination is made as to the use mode the device was in when the user last provided a volume preference. If the user last provided a volume preference in close talk mode, the process proceeds to block 312. Conversely, if the user last provided a volume preference in far talk mode, the process proceeds to block 310.

At block 310, an appropriate gain setting for use in close talk mode is computed from the user's volume preference set in far talk mode. In one embodiment, the gain setting for amplifier 152 is decreased in proportion to the increase in sound pressure level that a user would experience by moving the portable device from a position in far talk mode to a position in close talk mode. For example, if mobile phone 100 is typically held sixteen inches from a user's ear in far talk mode and one-half inch from the user's ear in close talk mode, the sound pressure level at the user's ear may increase 30 dB when the mobile phone is moved from far talk mode to close talk mode. This value may be identified by the designer as SpeakerCloseAtten discussed above, and can be specified based on any suitable design criteria relating to relative distance in close-talk and far-talk modes. Accordingly, at block 310, a gain setting is computed which represents the gain setting to deliver the user's preferred volume as set in far talk mode compensated by SpeakerCloseAtten. The compensation may be performed in any suitable way, such as, for example, subtracting SpeakerCloseAtten from SpeakerFarPref. Processing then proceeds to block 312 to determine whether the computed value of gain is appropriate to load into register 154.

At block 312, the computed gain setting is compared to the maximum value, SpeakerCloseMax, for use in close talk mode. If the computed gain value is less than SpeakerCloseMax, the computed value is used, and if the computed value exceeds it, the gain value is set to SpeakerCloseMax. The processing at block 312 ensures that the computed value of gain for the amplifier does not exceed the maximum value specified by the designer as SpeakerCloseMax. When the process arrives at block 312 through block 310, the value computed at block 310 is used as the computed gain value. If processing arrived at block 312 directly from decision block 308, because the user's preferred volume setting was set in close talk mode, the gain corresponding to the user's preferred setting is used as the computed value.

Once a gain value is computed at block 312, processing proceeds to block 314. At block 314, the gain value for amplifier 152 is loaded into register 154, and the process returns to block 302. The process may repeat continuously for as long as mobile phone 100 is in operation.

When it is determined at block 304 that the phone is in far talk mode, processing proceeds to decision block 315, where a determination is made as to whether the user last set the preferred volume level in close talk mode or far talk mode.

Where the user set the preferred volume level in close talk mode, processing proceeds to block 316. At block 316 a gain value is computed. Processing block 316 may be considered the inverse of processing block 310. A value representing the change in sound pressure level between close talk and far talk modes may be used to compensate for the gain value corresponding to the user's preferred volume setting. The compensation may be performed in any suitable way, such as, for example, adding SpeakerFarAtten to UserClosePref.

Conversely, if the user set a preferred volume level in far talk mode, processing proceeds directly to processing block 318. At processing block 318, the computed gain settings are compared to a maximum value set by the device designer, SpeakerFarMax. So long as the computed values are less than SpeakerFarMax, the computed value of the gain is used, whereas if SpeakerFarMax is exceeded, SpeakerFarMax is used. When the process arrives at block 318 through block 316, the computed value in that block is used as the computed value. Where the process proceeded directly from decision block 315 to block 318, the user's preferred setting is selected at block 318.

Once the gain value is selected, processing proceeds to block 314. At block 314, the selected value is loaded into register 154 and the process loops back to block 302.

Figure 4:
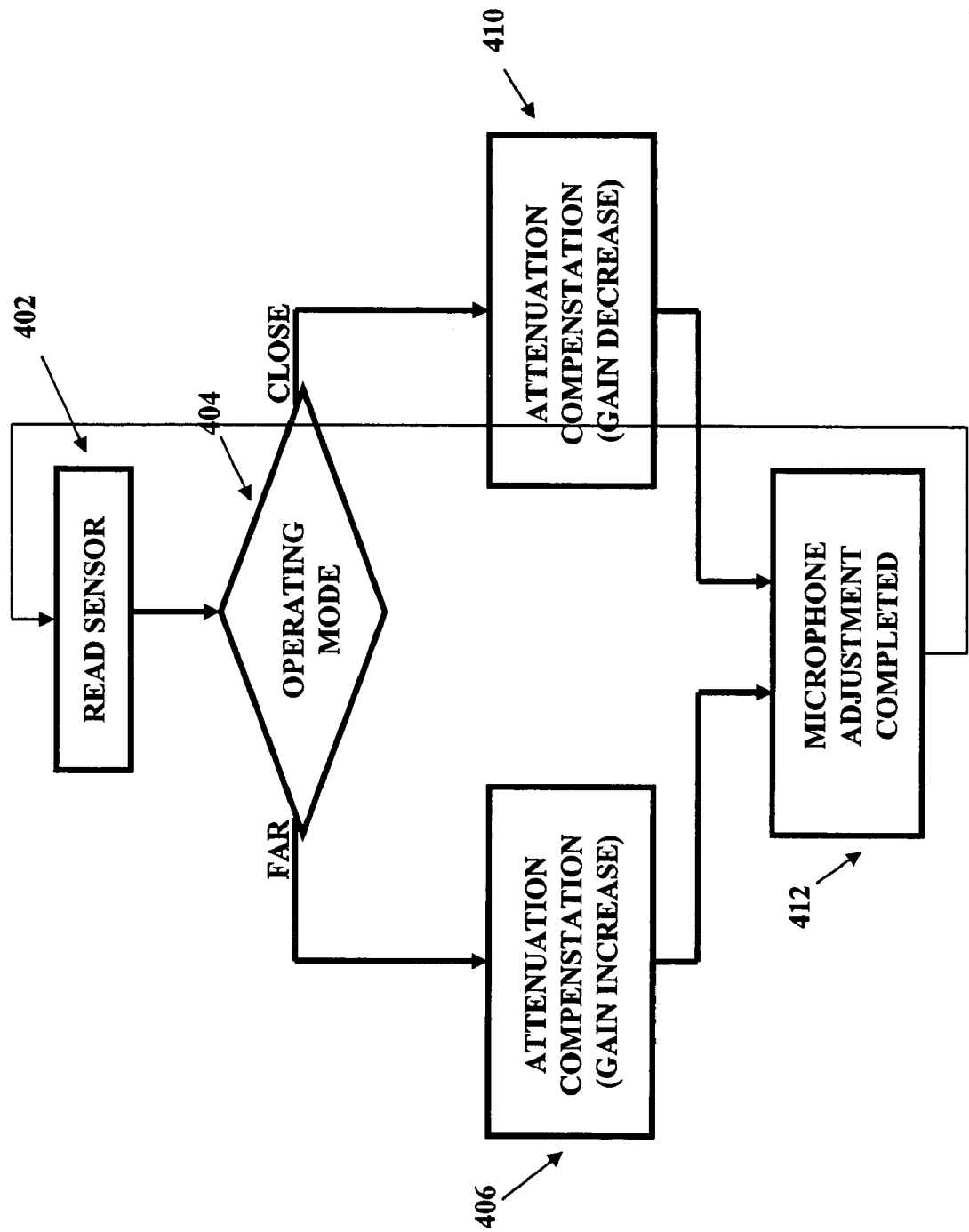
FIG. 4 is a flow chart of a process used to adjust microphone gain levels in the portable device of FIG. 1 in accordance with one embodiment of the invention.

FIG. 4 shows a flow chart of a process that may be used to adjust the gain in amplifier 162 for microphone 106. The process begins at block 402, where the output of sensor 102 is read, and proceeds to block 404 to determine the operating mode of mobile phone 100.

When the device is determined to be in a close talk operating mode, the process continues at block 410, wherein the appropriate gain setting for amplifier 162 is determined for a close talk mode. The gain setting may be computed in any suitable manner. In one embodiment, a fixed microphone gain is used in close talk mode, so that block 410 may simply read the gain value from a storage element (e.g., memory).

In other embodiments, the gain setting for amplifier 162 may be computed. For example, a desired gain setting may have been specified in a far talk mode, either by a user through a control in mobile phone 100 or as a constant value set by the device designer. In this case, processing at block 410 would reduce this gain setting by compensating (in any suitable way) for the change in sound pressure level at the microphone as the device is moved from the far talk mode to the close talk mode.

When it is determined at decision block 404 that the device is in far talk mode, the process proceeds to block 406, wherein the appropriate gain setting for amplifier 162 is determined in a far talk mode. The gain setting might be established in any suitable manner. In one embodiment, a fixed microphone gain is used in far talk mode, so that the gain value may be read from a storage location.

In other embodiments, the gain setting for amplifier 162 may be computed. For example, a desired setting may have been specified in the close talk mode, either by a user through a control in mobile phone 100 or as a constant value set by the device designer. In this case, processing at block 406 would increase this gain setting by compensating for (in any suitable manner) for the change in sound pressure level at the microphone as the device is moved from the close talk mode to the far talk mode.

The increase in gain of microphone 104 for far talk mode is especially beneficial for voice command features, such as with the MICROSOFT® voice command software, as having the mobile phone 100 in a far talk position allows a user access to display screen 108. The gain control for microphone 106 may result in command signals that show less variability as the mode of use changes, therefore resulting in more accurate recognition. However, the invention is not limited in this respect and could be employed with devices that do not have voice commands or displays.

Having described several embodiments of the invention, it is to be appreciated various alterations, modifications, and improvements will readily occur to those skilled in the art.

For example, a mobile telephone is used as an example of a portable electronic device. However, the same principles can be applied to other types of devices including those termed mobile, personal or hand-held electronic devices, all of which are generally intended to be included within the description of "portable electronic devices." More generally, the entire electronic device need not be "portable." The invention might be employed with any device with an audio-interface that is movable. For example, a desk top telephone with a handset might employ aspects of the invention.

As another example, input to the amplifier 152 for speaker 104 is shown to be provided in digital form from controller 150 in FIG. 1B. It is not necessary that the input to the speaker amplifier 152 be generated by controller 150. The source of the signal provided to speaker 104 may depend on the function of the portable electronic device. The input could, for example, come from a memory or from another circuit element, such as a receiver. It is also not necessary that the input to the speaker amplifier 152 be provided in digital form.

Also, it is not necessary that the input to speaker 104 be derived from a single source. For example, in a mobile telephone, some inputs to the speaker could be provided by a receiver while others might be provided by a controller. In this way, a user could listen through the same speaker to a telephone call and menu choices in audio form.

Similarly, the output of microphone 106 need not be converted to digital form or provided to controller 150, and it could likewise be provided to multiple sources, depending on the specific function being performed by the device.

As a further example of possible variations, it is described that the mode of use of the portable electronic device is determined by a proximity sensor. Other types of sensors may also or alternately be used to ascertain the mode of use. For example, an accelerometer may be used to detect motion of the device to allow controller 150 or other circuitry to detect that the device is being moved closer or further from the user's face, or a gravity based sensor might be used to detect the orientation of the portable electronic device. An upright orientation could be used as an indication that the device is held to the user's ear while a horizontal orientation could be used as an indication that the device is held away from the user's face.

Further, it is not necessary that a single sensor be used, as multiple sensors could be used. Multiple sensors of the same type could be used to reduce the probability of a faulty reading changing the mode of use undesirably. Alternatively, multiple sensors of different types could be used together to ascertain the mode of use of the electronic device.

Also, while a capacitive type proximity sensor is described above, other ways to measure proximity are possible. As an example, published US patent application US2004/0142705 entitled Proximity Sensor with Adaptive Threshold, assigned to the present assignee, describes other implementations of proximity sensors, and the disclosure thereof is incorporated herein in its entirety.

Further, the invention was described in connection with a device having two user modes—a "close talk" and a "far talk" mode. A device could be constructed with one or more intermediate modes, which may be determined based on the output of a proximity sensor. Each mode may have an appropriate gain value for the microphone and speaker. For example, the mode might be continuously variable, with the proximity sensor outputting an indication of the distance between the device and the user. In this embodiment, controller 150, or another circuit within mobile phone 100, may compute appropriate gain settings based on the distance between the user and the device.

The output of a sensor that indicates mode of use need not be used only to adjust a gain of an amplifier. Once controller 150 detects that the mode of use has changed, it may change any characteristic of any user interface. For example, in a pocket PC that normally displays menu choices on a screen, upon detecting that the device is being used in a close mode, the controller may use a speech generation program to have menu choices communicated to the user through speaker 104 as audio signals.

As yet a further example, it was described that the proximity sensor generally produces an indication of the mode of use based on the distance between the device and a user's face. However, use of the proximity sensor need not be limited to sensing proximity to the user's face. The proximity sensor may indicate close talk mode when any body part is placed near the sensor. In the embodiment shown in FIG. 1, sensor 102 is intentionally visible in surface 110, and is positioned such that a user holding the device may place a finger over the sensor. In this way, users may keep their devices in close talk mode even as the devices are removed from their faces temporarily.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed using microcode or software to perform the functions recited above.

It should be appreciated that the various methods or processes outlined herein may be coded as software that is executable on one or more processors that employ any one of a variety of operating systems or platforms. Additionally, such software may be written using any of a number of suitable programming languages and/or conventional programming or scripting tools, and also may be compiled as executable machine language code.

In this respect, it should be appreciated that one embodiment of the invention is directed to a computer readable medium (or multiple computer readable media) (e.g., a computer memory, one or more floppy discs, compact discs, optical discs, magnetic tapes, etc.) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

It should be understood that the term "program" is used herein in a generic sense to refer to any type of computer code or set of instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiment.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An electronic device comprising:
   an audio user interface having a gain control input;
   a graphical user interface;
   a sensor having a sensor output indicating proximity of the sensor to a human body part; and
   a control circuit having an input connected to the sensor output and a control output connected to the gain control input of the audio user interface, the control circuit setting a signal level on the control output selectively in response to a signal level on the control circuit input;
   the control circuit further configured to perform the acts of:
      setting a mode of operation of the electronic device, wherein the act of setting the mode of operation comprises determining whether the device is in a close mode or a far mode; and
      exchanging information with a user through at least one user interface of the audio user interface and the graphical user interface, the at least one user interface selected based on the determined mode of use, wherein the act of exchanging information with the user comprises providing a plurality of menu choices to the user through the graphical user interface when the determined mode of use is the far mode and providing the plurality of menu choices to the user through the audio user interface when the determined mode of use is the close mode.

2. The electronic device of claim 1, wherein the audio user interface comprises a speaker.

3. The electronic device of claim 2, wherein providing the information to the user through the audio user interface when the determined mode of use is the close mode comprises utilizing a speech generation program.

4. The electronic device of claim 2, wherein the device is a mobile telephone.

5. The electronic device of claim 2, wherein the device is a pocket PC or a music player.

6. The electronic device of claim 1, wherein the audio user interface further comprises a microphone.

7. The electronic device of claim 1, wherein the sensor comprises a capacitive sensor.

8. The electronic device of claim 1, wherein the electronic device has a housing and the sensor and the audio user interface and the graphical user interface are in the housing.

9. An electronic device, comprising:
   a housing;
   an audio user interface mounted in the housing, the audio user interface having a gain control input;
   a graphical user interface;
   a sensor mounted in the housing, the sensor having a sensor output representative of a mode of use of the electronic device; and
   a control circuit having an input connected to the sensor output and a control output connected to the gain control input of the audio user interface, the control circuit setting a signal level on the control output selectively in response to a signal level on the control circuit input;
   the control circuit further configured to perform the acts of:
      setting a mode of use of the electronic device, wherein the act of setting the mode of use comprises determining whether the device is in a close mode or a far mode;
      exchanging information with a user through at least one user interface of the audio user interface and the graphical user interface, the at least one user interface selected based on the determined mode of use, wherein the act of exchanging information with the user comprises receiving user commands through the graphical user interface when the determined mode of use is the far mode and receiving the user commands through the audio user interface when the determined mode of use is the close mode.

10. The electronic device of claim 9, wherein the housing has at least one surface and the electronic device additionally comprises a display screen mounted adjacent the at least one surface.

11. The electronic device of claim 9, wherein the sensor comprises a capacitive proximity sensor.

12. The electronic device of claim 9, wherein the audio user interface comprises a speaker and a variable gain amplifier.

13. The electronic device of claim 9, wherein the audio user interface comprises a microphone and a variable gain amplifier.

14. The electronic device of claim 9, wherein the receiving the commands through the audio user interface when the determined mode of use is the close mode comprises utilizing a voice recognition program.

15. A method of operating an electronic device having a plurality of user interfaces comprising at least a graphical user interface and an audio user interface, the method comprising acts of:
   detecting the proximity of the device to a human body part;
   automatically adjusting at least one operating characteristic of a user interface in the electronic device based on the detected proximity to a human body part;
   determining a mode of use of the electronic device from the detected proximity, wherein the act of determining the mode of use comprises determining whether the device is in a close mode or a far mode; and
   exchanging information with a user through at least one of the plurality of user interfaces selected based on the determined mode of use,
   wherein the act of exchanging information with the user comprises receiving from the user commands through the graphical user interface when the determined mode of use is the far mode and receiving from the user the commands through the audio user interface when the determined mode of use is the close mode.

16. The method of operating an electronic device of claim 15, wherein the electronic device has a surface with the audio user interface therein and the act of detecting the proximity of the device to a human body part comprises detecting the proximity of a human body part to the surface.

17. The method of operating an electronic device of claim 16, wherein the act of detecting the proximity of a human body part to the surface comprises sensing the proximity of a human body part with a sensor mounted in the surface.

18. The method of operating an electronic device of claim 15, wherein the act of automatically adjusting an operating characteristic of a user interface comprises adjusting a gain of an amplifier associated with a microphone receiving the user commands.

19. The method of operating an electronic device of claim 18, wherein the act of automatically adjusting a gain of the audio user interface comprises reducing the gain of the amplifier when a human body part is detected in proximity to the electronic device.

20. The method of operating an electronic device of claim 15, wherein the act of automatically adjusting at least one operating characteristic comprises adjusting a gain of a microphone receiving the user commands.

21. The method of operating an electronic device of claim 15, wherein the act of adjusting at least one operating characteristic comprises adjusting a volume of a speaker.

22. The method of operating an electronic device of claim 21, wherein the act of adjusting at least one operating characteristic additionally comprises adjusting a gain of a microphone.

23. The method of operating an electronic device of claim 21, additionally comprising an act of receiving from a user of the device a volume setting for the speaker, the received volume setting having a gain for the speaker associated therewith.

24. The method of operating an electronic device of claim 23 wherein the act of adjusting the volume of the speaker comprises, when the device is operating in the close mode, setting the gain to a minimum of the gain associated with the received user volume setting and a predetermined gain.

25. The method of operating an electronic device of claim 24, wherein the act of receiving from a user of the device a volume setting for the speaker comprises receiving from the user of the device a volume setting for the speaker while the device is in the close mode.

26. The method of operating an electronic device of claim 23 wherein the act of adjusting the volume of the speaker comprises, when the device is operating in the close mode, setting the gain to a minimum of the gain associated with the received user volume setting compensated by a predetermined amount and a predetermined gain.

27. The method of operating an electronic device of claim 23, wherein the act of receiving from a user of the device a volume setting for the speaker comprises receiving from the user of the device a volume setting for the speaker while the device is in the far mode.

28. The method of operating an electronic device of claim 26 wherein the act of setting the gain to the predetermined gain comprises setting the gain to a gain associated with a sound pressure level at the output of the speaker that does not cause discomfort for a user when the speaker is held to the user's ear.

29. The method of operating an electronic device of claim 15 wherein the user providing the first information through the audio user interface when the determined mode is the close mode comprises utilizing a voice recognition program.

30. The method of operating an electronic device of claim 15 wherein the act of exchanging information with the user further comprises providing second information to the user through the graphical user interface when the determined mode of use is the far mode and providing the second information to the user through the audio user interface when the determined mode of use is the close mode.

31. The method of operating an electronic device of claim 30 wherein providing the second information to the user through the audio user interface when the determined mode of use is the close mode comprises utilizing a speech generation program.

32. A method of operating an electronic device having a plurality of user interfaces comprising at least a graphical user interface and an audio user interface, the method comprising the acts of:

measuring at least one value relating to a use environment of the device;

determining a mode of use of the electronic device from the at least one measured value, wherein the act of determining the mode of use comprises determining whether the device is in a close mode or a far mode; and exchanging information with a user through at least one of the plurality of user interfaces selected based on the determined mode of use, wherein the act of exchanging information with the user comprises providing first information to the user through the graphical user interface when the determined mode of use is the far mode and providing the first information to the user through the audio user interface when the determined mode of use is the close mode.

33. The method of operating an electronic device of claim 32, wherein the at least one value relates to proximity and wherein the act of determining the mode of use comprises determining a mode of use based on the proximity of the electronic device to a user's face.

34. The method of operating an electronic device of claim 32, wherein providing the first information to the user through the audio user interface when the determined mode of use is the close mode comprises utilizing a speech generation program.

35. The method of operating an electronic device of claim 32 wherein the act of exchanging information with the user further comprises the user providing second information through the graphical user interface when the determined mode of use is the far mode and the user providing the second information through the audio user interface when the determined mode of use is the close mode.

36. The method of operating an electronic device of claim 35 wherein the user providing the second information through the audio user interface comprises utilizing a voice recognition program.

* * * * *